(12) United States Patent
Kanishima et al.

(10) Patent No.: US 8,498,429 B2
(45) Date of Patent: Jul. 30, 2013

(54) ACOUSTIC CORRECTION APPARATUS, AUDIO OUTPUT APPARATUS, AND ACOUSTIC CORRECTION METHOD

(75) Inventors: Yasuhiro Kanishima, Tokyo (JP); Takanobu Mukaide, Tokyo (JP); Toshifumi Yamamoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 196 days.

(21) Appl. No.: 13/044,327

(22) Filed: Mar. 9, 2011

(65) Prior Publication Data
US 2012/0002823 A1    Jan. 5, 2012

(30) Foreign Application Priority Data
Jun. 30, 2010    (JP) ................ 2010-150305

(51) Int. Cl.
 H04R 29/00 (2006.01)
 H04B 3/20 (2006.01)
 H04B 15/00 (2006.01)
 H03G 5/00 (2006.01)

(52) U.S. Cl.
 USPC ............ 381/94.2; 381/56; 381/66; 381/94.9; 381/98

(58) Field of Classification Search
 USPC .............. 381/98, 56, 103, 101, 94.2, 94.9, 381/66, 61, 63
 See application file for complete search history.

(56) References Cited

U.S. PATENT DOCUMENTS
2005/0157891 A1* 7/2005 Johansen ............... 381/103
2009/0052680 A1* 2/2009 Wang et al. ............. 381/59

FOREIGN PATENT DOCUMENTS

| JP | 2000-152374 A | 5/2000 |
|---|---|---|
| JP | 2003224898 | 8/2003 |
| JP | 2005072676 | 3/2005 |
| JP | 2006-173943 A | 6/2006 |
| JP | 2008085647 | 4/2008 |
| JP | 2009-077198 A | 4/2009 |
| JP | 2009284097 | 12/2009 |

OTHER PUBLICATIONS

Japanese Office Action for Application 2010-150305 dated Jul. 19, 2011.

* cited by examiner

*Primary Examiner* — Vivian Chin
*Assistant Examiner* — Douglas Suthers
(74) *Attorney, Agent, or Firm* — Patterson & Sheridan LLP (57) ABSTRACT

According to one embodiment, an acoustic correction apparatus includes an input module, a calculator, a divider, a converter, an extractor, a synthesizer, and a generator. The input module receives an audio signal propagated through a sound field. The calculator calculates an impulse response from the audio signal. The divider divides the impulse response into first and second impulse responses. The converter converts the first and second impulse responses into first and second frequency spectrums. The extractor specifies an amplitude component of the first frequency spectrum with a peak relatively higher than that of the amplitude component of the first frequency spectrum, and extracts the peak as a resonance component. The synthesizer synthesizes a first property and a second property for attenuating the resonance component. The generator generates a correction filter for performing correction to obtain the synthesized property.

5 Claims, 5 Drawing Sheets

000# ACOUSTIC CORRECTION APPARATUS, AUDIO OUTPUT APPARATUS, AND ACOUSTIC CORRECTION METHOD

CROSS-REFERENCE TO RELATED APPLICATIONS

This application is based upon and claims the benefit of priority from Japanese Patent Application No. 2010-150305, filed on Jun. 30, 2010, the entire contents of which are incorporated herein by reference.

FIELD

Embodiments described herein relate generally to an acoustic correction apparatus, an audio output apparatus, and an acoustic correction method.

BACKGROUND

Conventionally, there exist variety of disturbance factors against audio signal reproduction of various audio visual (AV) devices such as a television during audio output. Therefore, there has been proposed various techniques to obtain a true sound quality for the output sound.

For example, one of the conventional techniques automatically optimizes a frequency, amplitude, and a bandwidth of a digital audio filter, and equalizes a loudspeaker using the digital audio filter.

However, the conventional techniques do not focus on resonance in a housing to which the audio signal is output. Thus, the audio signal output by the conventional techniques contains a component corresponding to the resonance in the housing. As a result, a listener feels sense of discomfort from such audio signal.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, an acoustic correction apparatus includes an input module, a calculator, a divider, a converter, an extractor, a synthesizer, and a generator. The input module is configured to receive an audio signal propagated through a sound field. The calculator is configured to calculate an impulse response from the audio signal. The divider is configured to divide the impulse response into a first impulse response of a first time region preliminarily determined as a time region including a direct sound or an initial reflection sound and a second impulse response of a second time region preliminarily determined as a time region including a reverberant sound component. The converter is configured to convert the first impulse response into a first frequency spectrum and the second impulse response into a second frequency spectrum. The extractor is configured to specify an amplitude component of the second frequency spectrum with a peak relatively higher than that of an amplitude component of the first frequency spectrum, and extract the peak as a resonance component. The synthesizer is configured to synthesize a first property and a second property for attenuating the resonance component. The generator is configured to generate a correction filter configured to perform correction to obtain the synthesized property.

According to another embodiment, a sound output apparatus includes an output module, an input module, a calculator, a divider, a converter, an extractor, a synthesizer, a generator, and a filter. The output module is configured to output an audio signal. The input module is configured to receive the audio signal output by the output module and propagated through a sound field. The calculator is configured to calculate an impulse response from the audio signal. The divider is configured to divide the impulse response into a first impulse response of a first time region preliminarily determined as a time region including a direct sound or an initial reflection sound and a second impulse response of a second time region preliminarily determined as a time region including a reverberant sound component. The converter is configured to convert the first impulse response into a first frequency spectrum and the second impulse response into a second frequency spectrum. The extractor is configured to specify an amplitude component of the second frequency spectrum with a peak relatively higher than that of an amplitude component of the first frequency spectrum, and extract the peak as a resonance component. The synthesizer is configured to synthesize a first property and a second property for attenuating the resonance component. The generator is configured to generate a correction filter configured to perform correction to obtain the synthesized property. The filter configured to filter the audio signal output by the output module by using the correction filter generated by the generator.

According to still another embodiment, an acoustic correction method executed by an acoustic correction apparatus, includes: receiving, by an input module, an audio signal propagated through a sound field; calculating, by a calculator, an impulse response from the audio signal; dividing, by a divider, the impulse response into a first impulse response of a first time region preliminarily determined as a time region including a direct sound or an initial reflection sound and a second impulse response of a second time region preliminarily determined as a time region including a reverberant sound component; converting, by a converter, the first impulse response into a first frequency spectrum and the second impulse response into a second frequency spectrum; specifying, by an extractor, an amplitude component of the second frequency spectrum with a peak relatively higher than that of an amplitude component of the first frequency spectrum, and extracting the peak as a resonance component; synthesizing, by a synthesizer, a first property and a second property for attenuating the resonance component; and generating, by a generator, a correction filter configured to perform correction to obtain the synthesized property.

Figure 1:
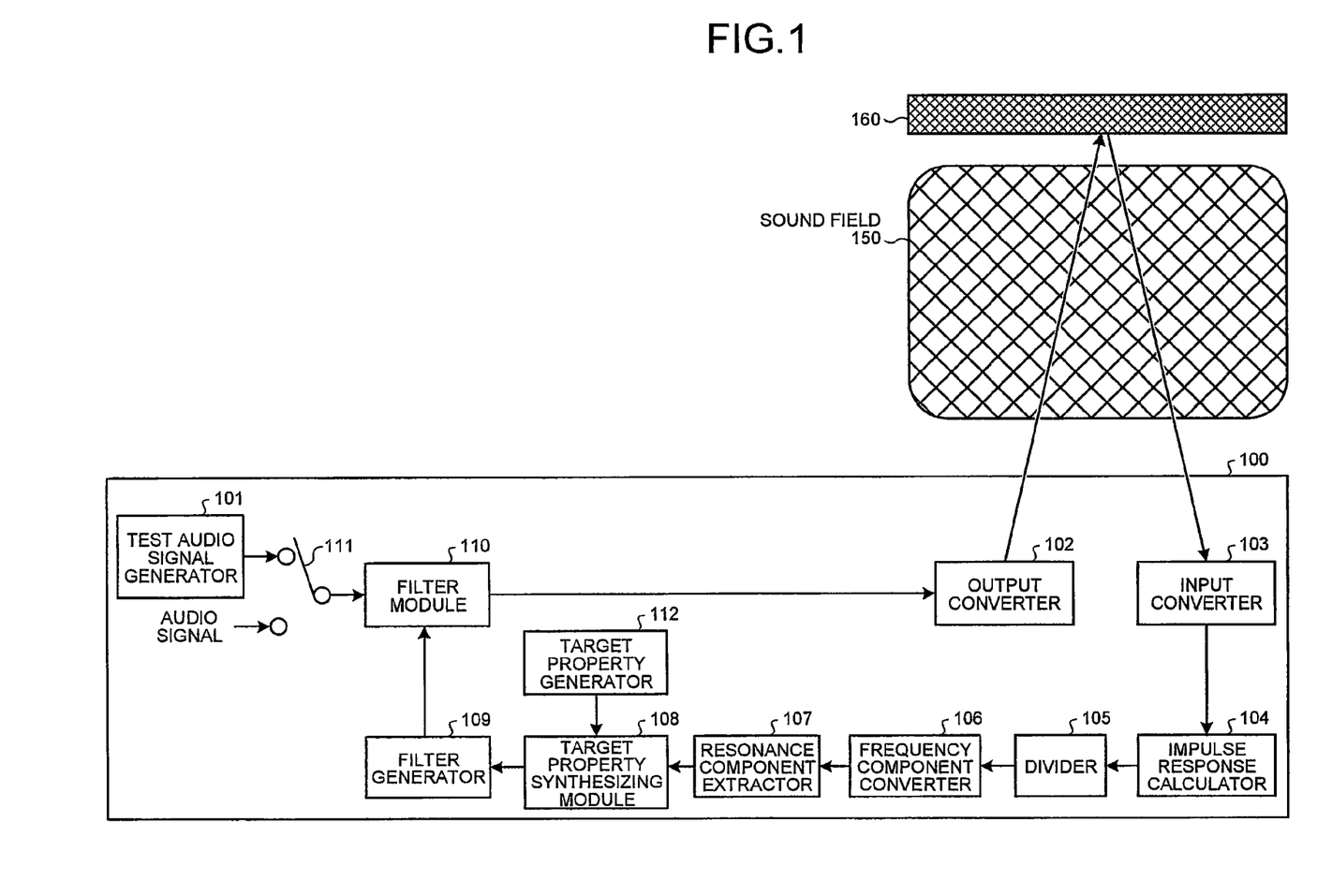
FIG. 1 is an exemplary block diagram of a configuration of an acoustic reproduction apparatus according to an embodiment.

FIG. 1 is a block diagram of a configuration of an acoustic reproduction apparatus 100 according to an embodiment. As illustrated in FIG. 1, an acoustic correction apparatus for acoustic correction is applied to the acoustic reproduction apparatus 100. The acoustic reproduction apparatus 100 includes a test audio signal generator 101, an output converter 102, an input converter 103, an impulse response calculator 104, a divider 105, a frequency component converter 106, a resonance component extractor 107, a target property synthesizing module 108, a filter generator 109, a filter module 110, a switch 111, and a target property generator 112.

A size and thickness of an electronic device in which a speaker is installed, such as a television image receiving apparatus, tends to decrease. In the electric device, it is popular to use a housing thereof as a speaker box. When the housing of the electronic device is used as a speaker box, degree of freedom for its structure is limited because various components are needed to be mounted. Besides, acoustic absorbent or the like cannot be provided to the housing, thereby rendering it difficult to remove acoustic disadvantage by redesigning the housing. Accordingly, resonance is induced within the housing of the electronic device due to multi reflection of a back sound from the speaker (generation of standing wave) or due to an eigenfrequency of components. As a result, when the housing of the electronic device is used as the speaker box, change in the sound pressure level of the resonant frequency makes a listener to feel sense of discomfort.

The resonance sound is largely delayed with respect to a direct sound. Therefore, the sense of discomfort felt by the listener cannot be alleviated even when a frequency property is flattened by an equalizer. Thus, the acoustic reproduction apparatus 100 of the embodiment includes a later described configuration to suppress the sense of discomfort felt by the listener due to the resonance sound of the housing. In the embodiment, the component of the resonance sound of the housing is treated as being included in a reverberant sound component of the sound signal, and processed.

The switch 111 is configured to switch between a normal audio signal and a test audio signal input from the test audio signal generator 101, to select an audio signal output by the acoustic reproduction apparatus 100 of the embodiment. In other word, the switch 111 connects between the test audio signal generator 101 and the filter module 110 when a correction filter is generated, and connects between a terminal for outputting the normal audio signal and the filter module 110 in other case.

The test audio signal generator 101 is configured to generate the test audio signal used to measure an acoustic property (impulse response) of the output converter 102 and a sound field. In the embodiment, a white noise signal, a pink noise signal, a band noise signal, a swept sign signal, and/or the like is used as the test audio signal. The test audio signal does not have to be generated every time the test audio signal is measured, and the test audio signal may be stored in and read out from a memory or the like.

The output converter 102 is configured to convert the test audio signal or the audio signal to be heard by a listener, from an electrical signal to an acoustic signal, and output it to the sound field. The output converter 102 may include a digital to analog converter and/or a power amplifier.

The input converter 103 is provided at a listening position of a user, and configured to collect the test audio signal propagated through a sound field 150. Further, the input converter 103 is configured to convert the collected test audio signal from an acoustic signal to an electric signal. The input converter 103 may include an analog to digital converter and/or a power amplifier.

Figure 2:
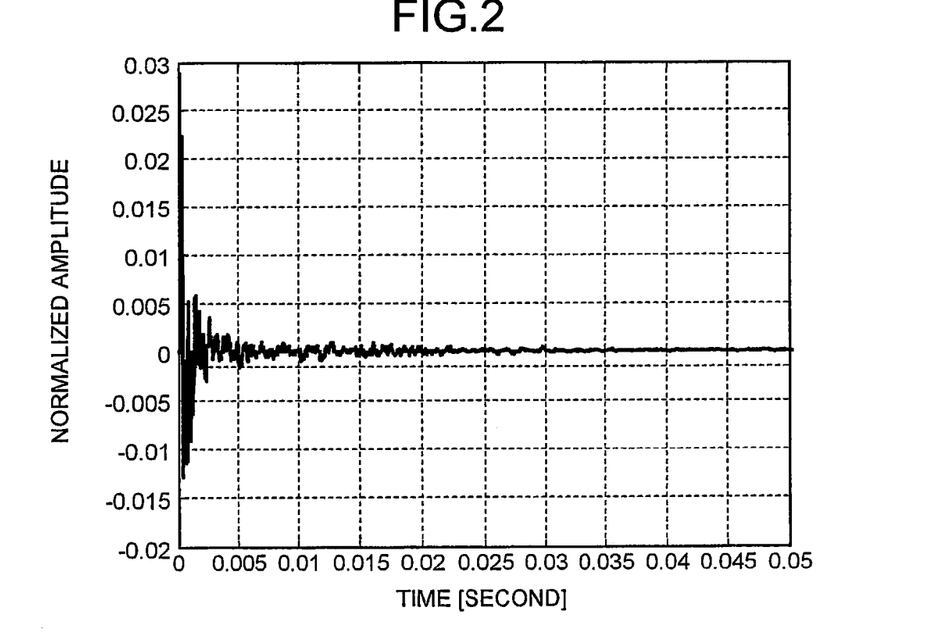
FIG. 2 is an exemplary graph of an impulse response calculated by an impulse response calculator in the embodiment.

The impulse response calculator 104 is configured to calculate an impulse response from the test audio signal converted to the electric signal. In particular, to calculate the impulse response, the impulse response calculator 104 of the embodiment convolutes the collected test audio signal with a signal having an inverse property of the test audio signal prior to the output. FIG. 2 is a graph of an impulse response calculated by the impulse response calculator 104. As illustrated by the impulse response of FIG. 2, initially the amplitude is large because it contains the direct sound component and the initial reflection sound component. However, as the time passes by, the amplitude becomes smaller because it contains only the reverberant sound component and the like.

The divider 105 is configured to divide the impulse response to a first impulse response of a first time region and a second impulse response of a second time region. The first time region is preliminarily determined as a time region containing the direct sound component and the initial reflection sound component. The second time region is preliminarily determined as a time region containing the reverberant sound component.

As described above, the divider 105 of the embodiment divides the impulse response by the first and the second time regions, which are defined based on division reference time. The divider 105 obtains the division reference time by dividing a path length traveled by the test audio signal by a sound speed.

The path length traveled by the test audio signal is a length traveled by the test audio signal from when the test audio signal is output to the sound field from the output converter 102 until when the output test audio signal is input to the input converter 103. The path length of the embodiment is a distance of a path traveled by a sound output from the output converter 102 reached directly to the input converter 103, or a distance of a path traveled by an initial reflection sound based on a sound output from the output converter 102 and reached the input converter 103. The initial reflection sound is a sound which is output from the output converter 102 and then reflected by a wall surface 160 or a floor for the first time. The initial reflection sound does not have to be taken into account, and only the direct sound may be taken into account. Furthermore, the divider 105 is not required to divide the impulse response at the division reference time, and the first and the second time regions may overlap each other.

For example, by having the path length of 1 m and the sound speed of 340 m/s, the divider 105 uses the division reference time of 2.94 ms obtained by dividing 1 m by 340 m/s, to divide the impulse response.

Then, a time region earlier than the division reference time is defined as the first time region including the direct sound component and the initial reflection sound component. Furthermore, a time region later than the division reference time is defined as the second time region including the reverberant sound.

The path length may be set by a user, or may be measured by a laser or the like. Furthermore, the path length may be set preliminarily before product shipment, based on an average room size and/or the like.

Figure 3:
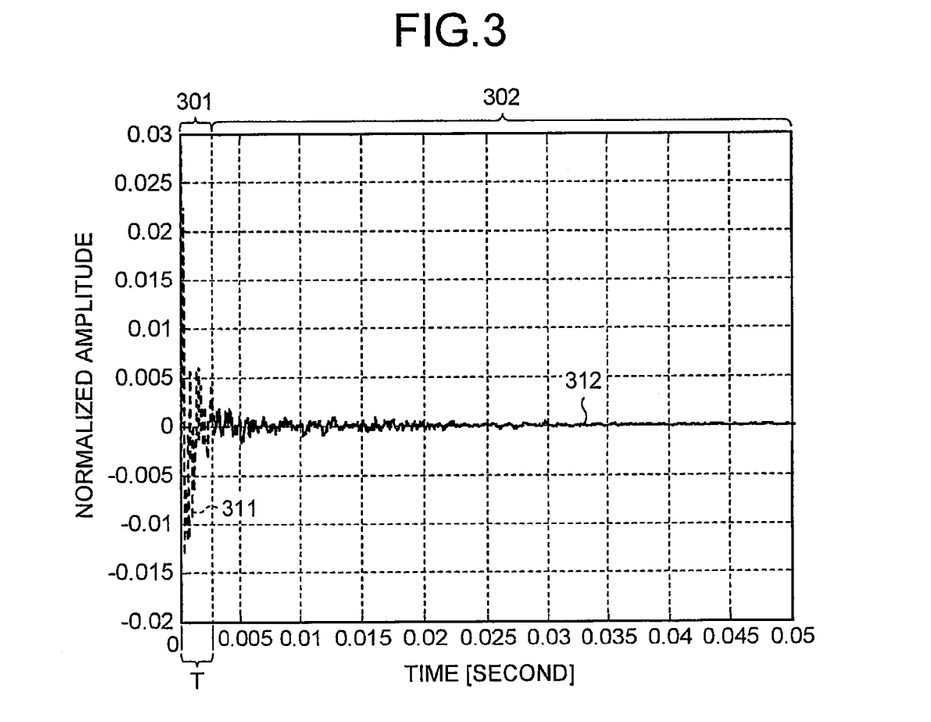
FIG. 3 is an exemplary graph of the impulse response divided by a divider in the embodiment.

FIG. 3 is a graph of an impulse response divided by the divider 105. In FIG. 3, the divider 105 divides the impulse response into the first impulse response of a first time region 301 and the second impulse response of a second time region 302, while having the division reference time T as a reference. Then, the divider 105 determines an impulse response 311

(the first impulse response) included in the first time region 301 as the direct sound component and the initial reflection sound component. Furthermore, the divider 105 determines an impulse response 312 (the second impulse response) included in the second time region 302 as the reverberant sound component.

The frequency component converter 106 is configured to convert the first impulse response of the first time region including the direct sound component and the initial reflection sound component into a first frequency spectrum and the second impulse response of the second time region including the reverberant sound component into a second frequency spectrum. The frequency component converter 106 of the embodiment converts the first and the second impulse responses into the first and the second frequency spectrums by using a Fourier Transformation or the like; however, any method may instead be used. When the Fourier Transformation is used, a window function may be applied to each component.

The resonance component extractor 107 is configured to extract a resonance component of a housing (housing resonance component) from the first frequency spectrum of the direct sound component and the initial reflection component and the second frequency spectrum of the reverberant sound component. The resonance component extractor 107 specifies a frequency region including an amplitude component in the second frequency spectrum, which is comparatively higher than an amplitude component of the first frequency spectrum. Then, the resonance component extractor 107 extracts a central frequency, bandwidth, and gain of the frequency region as the housing resonance component.

Figure 4:
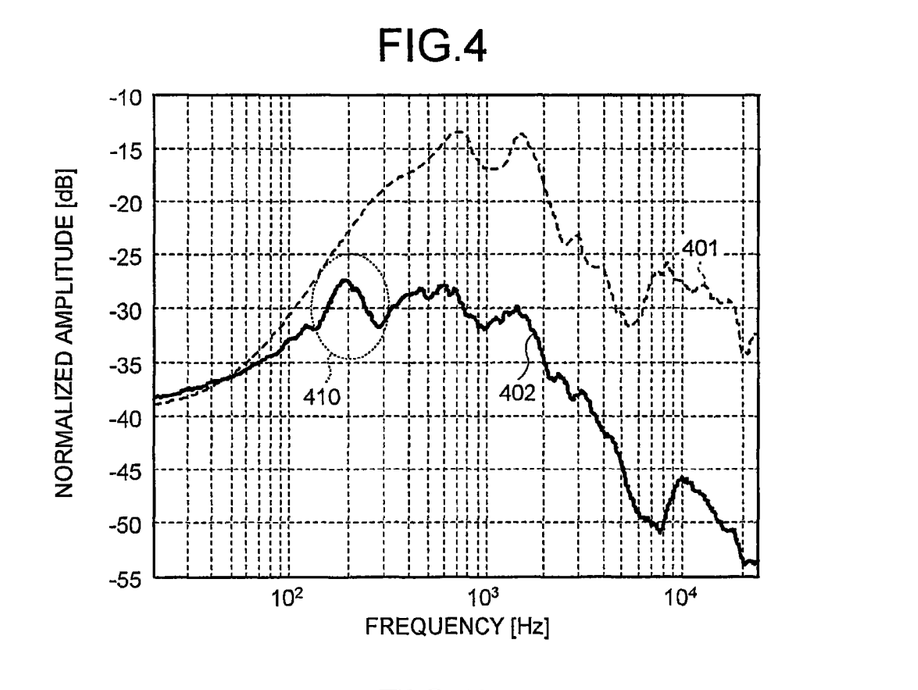
FIG. 4 is an exemplary graph of a frequency spectrum of a direct sound component and an initial reflection sound component, and of a reverberate sound component, in the embodiment.

FIG. 4 is a graph illustrating a frequency spectrum 401 (first frequency spectrum) of the direct sound component and the initial reflection sound component, and a frequency spectrum 402 (second frequency spectrum) of the reverberant sound component. As illustrated in FIG. 4, in comparison to the frequency spectrum 401, the frequency spectrum 402 of the reverberant sound component includes a relatively high frequency region 410. Thus, the resonance component extractor 107 extracts the relatively high frequency region 410 from the frequency spectrum 402 of the reverberant sound component.

As an example of the extraction, a cross spectrum between the first frequency spectrum and the second frequency spectrum is divided by the first frequency spectrum, and a peak is detected from the cross spectrum. Then, the frequency region with relatively high amplitude component of the second frequency spectrum including the reverberant sound including the housing reference sound and/or the like is obtained by the resonance component extractor 107 of the embodiment. The aforementioned extraction is only an example, and other techniques may be used for the extraction.

The target property generator 112 is configured to generate a preliminarily determined target property, and output it to the target property synthesizing module 108. Here, the target property is for correction of an audio signal so that a user feels comfortable listening to the output audio signal. The target property of the embodiment is flat up to 2 kHz, and −3 dB/oct above 2 kHz. However, the property is not limited thereto, and may be flat entirely, or various properties may be used. Furthermore, the target property does not have to be generated by the target property generator 112, but may be stored in and read out from a memory or the like.

The target property synthesizing module 108 is configured to synthesize the target property and a property which attenuates the housing resonance component derived based on the extracted housing resonance component. Then, the target property synthesizing module 108 takes log of the target property generated by the target property generator 112 and the property which attenuates the housing reference component, and add the target property and the property which attenuates the housing reference component. Here, the property which attenuates the housing reference component is an inverse property of the central frequency, bandwidth, and gain extracted as the housing reference component.

Figure 5:
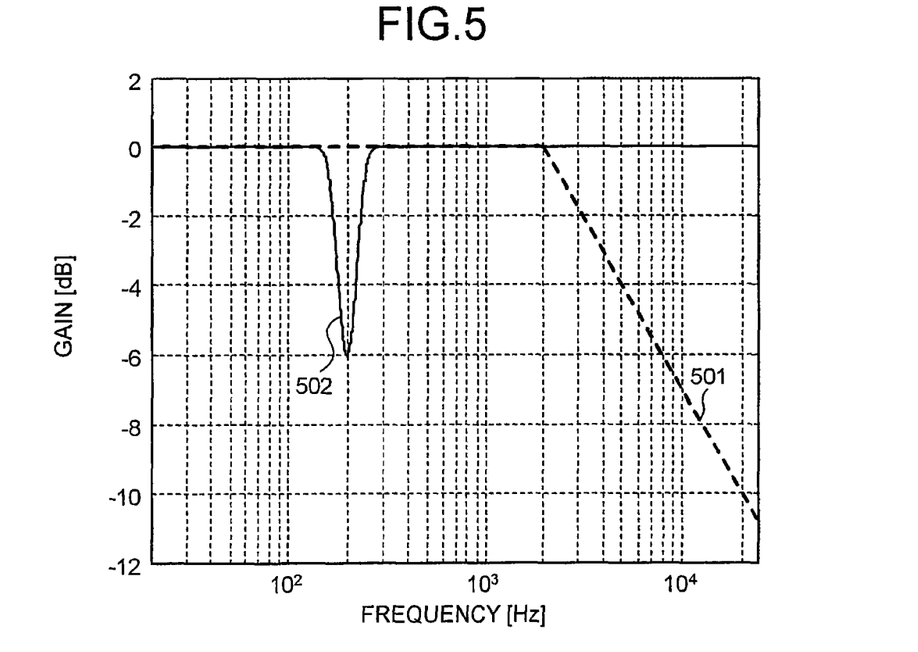
FIG. 5 is an exemplary graph illustrating a target property and an inverse property of an extracted resonance component of a housing in the embodiment.

FIG. 5 is a graph illustrating a target property 501 and an inverse property 502 of the extracted housing reference component. The target property synthesizing module 108 generates a property in which the target property 501 and the inverse property 502 of the extracted housing reference component illustrated in FIG. 5 are synthesized with each other. The gain of the inverse property 502 of the resonance component is set to an appropriate value based on the embodiment.

Figure 6:
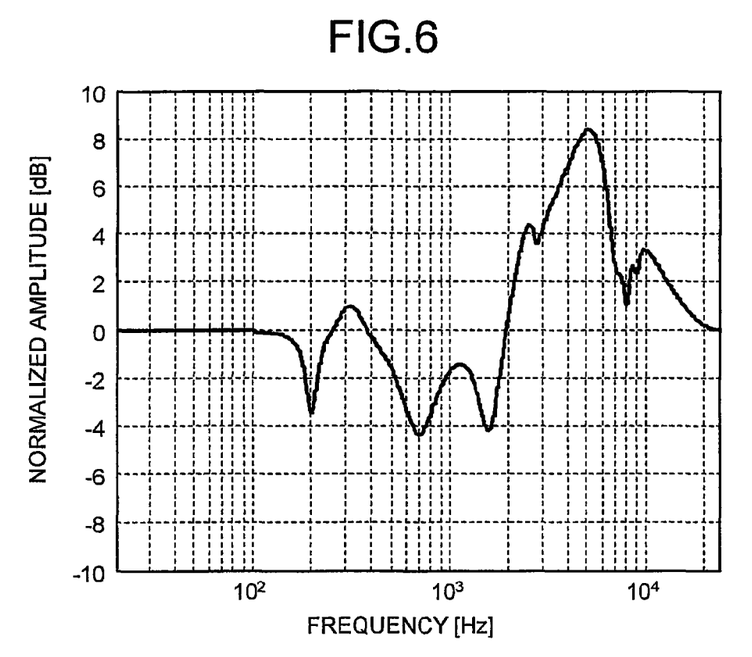
FIG. 6 is an exemplary graph of a correction filter generated by a filter generator in the embodiment.

The filter generator 109 is configured to generate a correction filter for correcting a frequency spectrum of the entire sound to the property in which the target property 501 and the inverse property 502 of the extracted housing resonance component are synthesized with each other. Any technique can be used to generate the correction filter, and for example, widely used least-mean-square (LMS) algorithm or the like can be used. FIG. 6 is a graph illustrating an example of the correction filter generated by the filter generator 109. For the correction, the correction filter of FIG. 6 is used.

Figure 7:
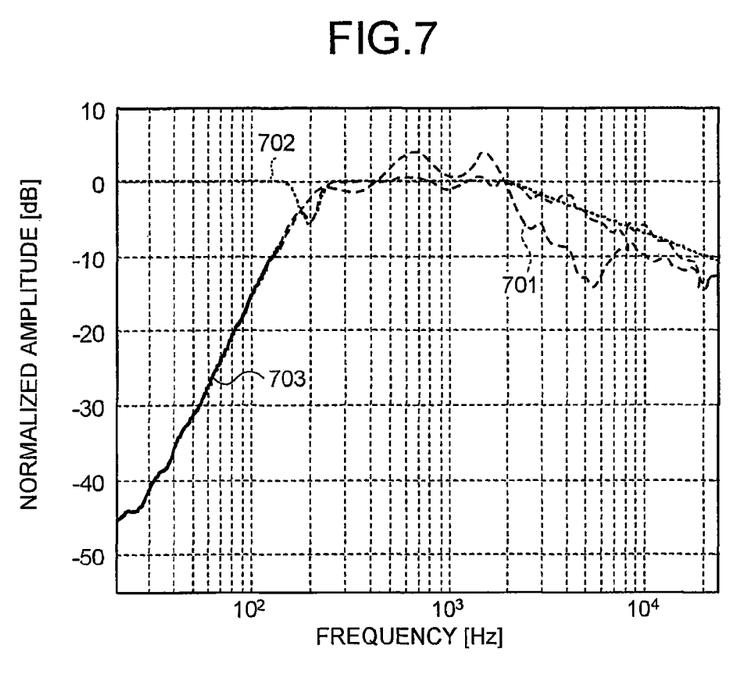
FIG. 7 is an exemplary graph illustrating correction by a filter module in the embodiment.

The filter module 110 is configured to correct the audio signal to be received and listened. FIG. 7 is a graph illustrating the correction performed by the filter module 110. FIG. 7 illustrates an example of correcting an acoustic property 701 of the output converter 102 and the sound field 150 so that the acoustic property 701 changes to a property 702 in which the target property 501 and the inverse property 502 of the extracted housing reference component are synthesized with each other. In order to perform such correction, the filter module 110 uses the correction filter of FIG. 6. Consequently, an audio signal corrected by the filter thus having an acoustic property 703 is output from the filter module 110. Since the aforementioned correction is performed on the output signal, the housing resonance component is suppressed.

The acoustic reproduction apparatus 100 of the embodiment includes the aforementioned configuration, thereby appropriate filtering can be performed on the audio signal. The filter of the acoustic reproduction apparatus 100 can be generated at any timing. If it is desired to perform the correction more in detail, the acoustic reproduction apparatus 100 may generate a filter appropriate for a sound field changed in accordance with an environmental change such as change of humidity, of curtain, or of a position of a user, based on the environmental change. On the other hand, if such detailed correction is not desired, a filter can be generated preliminarily before the shipment of the acoustic reproduction apparatus 100, by taking into account an average room in which the acoustic reproduction apparatus 100 is arranged.

Figure 8:
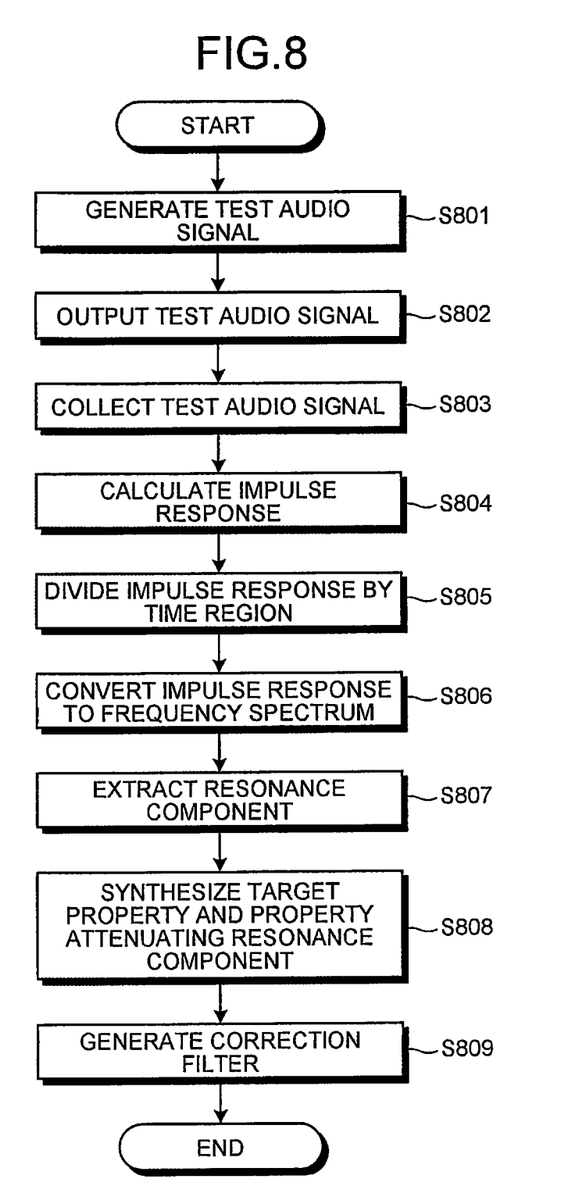
FIG. 8 is an exemplary flowchart of generation of the correction filter of the acoustic reproduction apparatus in the embodiment.

Next, generation of the correction filter in the acoustic reproduction apparatus 100 of the embodiment is explained. FIG. 8 is a flowchart of the aforementioned process by the acoustic reproduction apparatus 100 of the embodiment.

The test audio signal generator 101 generates the test audio signal (S801). Then, the output converter 102 converts the test audio signal from the electric signal to the acoustic signal, and output it to the sound field 150 (S802).

Subsequently, the input converter 103 collects the test audio signal propagated through the sound field 150, and convert the test audio signal from the acoustic signal to the electric signal (S803).

The impulse response calculator 104 then calculates the impulse response from the test audio signal converted to the electric signal (S804).

Next, the divider 105 divides the impulse response into the first and the second impulse responses of the time regions (first time region and second time region) based on the division reference time (S805).

Then, the frequency component converter 106 converts the impulse responses of the time regions to the frequency spectrums (S806).

The resonance component extractor 107 then extracts the housing reference component from the frequency spectrum of the direct sound component and the initial reflection sound component and from the frequency spectrum of the reverberant sound component (S807).

Next, the target property synthesizing module 108 synthesizes the predetermined target property and the property which attenuates the housing resonance component with each other (S808).

Subsequently, the filter generator 109 generates the correction filter for the correction to obtain the property in which the target property and the inverse property of the extracted housing reference component are synthesized with each other (S809).

Then, the filter module 110 performs the filtering using the correction filter generated by the aforementioned process.

A correction in which a target property is for example flat in frequency has conventionally been performed, but it does not take into account the housing resonance. Thus, the housing resonance component remains, thereby providing a user with a sense of discomfort listening to the sound.

On the other hand, the acoustic reproduction apparatus 100 of the embodiment performs the correction by using the correction filter generated by the aforementioned configuration. Accordingly, the correction for suppressing the housing resonance component is also performed when the acoustic property of the speaker and the sound field is corrected to the target property. As a result, a sound due to the housing resonance (sound due to housing) can be reduced, thereby becoming capable of removing the sense of discomfort of the listener when the sound is reproduced.

Furthermore, in the conventional technique, when the attenuation of the housing resonance and the correction of the frequency property are assumed to be taken into account, it is usually considered that filters are assigned to the attenuation and the correction, respectively. On the other hand, in the embodiment, it is not necessary to provide a plurality of filters for the acoustic reproduction apparatus 100 because the property which attenuates the housing resonance is synthesized with the target property. Thus, it becomes possible to reduce hardware resources or software resources.

In the embodiment, the acoustic reproduction apparatus 100 provided in the television image receiving apparatus is explained. However, the acoustic reproduction apparatus 100 may be applied to other devices. For example, the acoustic reproduction apparatus 100 may be applied to an external speaker provided to a personal computer or the like, or may be applied to an acoustic device such as a compact disk player. Furthermore, the acoustic reproduction apparatus 100 may be installed in a cellular phone, or may be applied to a headphone.

The acoustic reproduction apparatus 100 provided in the television image receiving apparatus has a hardware configuration including a central processing unit (CPU), a read only memory (ROM), and a random access memory (RAM). The audio processing program of the embodiment may be configured so as to be preliminarily installed in the ROM or the like and provided.

The acoustic processing program executed by the acoustic reproduction apparatus 100 of the embodiment includes a module configuration including the aforementioned modules (the test audio signal generator, the output converter, the input converter, the impulse response calculator, the divider, the frequency component converter, the resonance component extractor, the target property synthesizing module, the filter generator, the filter module). As an actual hardware, the acoustic processing program is read out from the aforementioned storage medium and executed by the CPU. Then, the aforementioned modules are loaded on the RAM, and the test audio signal generator, the output converter, the input converter, the impulse response calculator, the divider, the frequency component converter, the resonance component extractor, the target property synthesizing module, the filter generator, and the filter module are generated on the RAM.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An acoustic correction apparatus comprising:
one or ore hardware processors;
an input module configured to receive a first audio signal propagated through a sound field;
a calculator configured to calculate, by operation of the one or more hardware processor, an impulse response from the audio signal;
a divider configured to divide the impulse response into a first impulse response of a first time region preliminarily determined as a time region comprising a direct sound or an initial reflection sound and a second impulse response of a second time region preliminarily determined as a time region comprising a reverberant sound component;
a converter configured to convert the first impulse response into a first frequency spectrum and the second impulse response into a second frequency spectrum;
an extractor configured to specify, from a cross spectrum between the first frequency spectrum converted from the first impulse response of the first time region and the second frequency spectrum converted from the second impulse response of the second time region, an amplitude component of the second frequency spectrum with a peak relatively higher than that of an amplitude component of the first frequency spectrum, and extract the peak as a resonance component;
a synthesizer configured to synthesize a first property with a second property for attenuating the resonance component to generate a synthesized property; and a generator configured to generate, based on the synthesized property, a correction filter configured to correct a second audio signal to be listened to.

2. The acoustic correction apparatus of claim 1, wherein the divider is configured to divide the impulse response into the first impulse response of the first time region and the second impulse response of the second time region, the first time region being determined based on a sound speed and a path length traveled by a sound output to the sound field until the sound directly reaches the input module or traveled by a sound output to the sound field until the sound reaches the input module after the sound is reflected by a wall or a floor.

3. A sound output apparatus comprising:
one or more hardware processors;
an input module configured to receive a second audio signal corresponding to the first audio signal output by the output module and propagated through a sound field;
a calculator configured to calculate, by operation of the one or more hardware processors, an impulse response from the second audio signal;
a divider configured to divide the impulse response into a first impulse response of a first time region preliminarily determined as a time region comprising a direct sound or an initial reflection sound and a second impulse response of a second time region preliminarily determined as a time region comprising a reverberant sound component;
a converter configured to convert the first impulse response into a first frequency spectrum and the second impulse response into a second frequency spectrum;
an extractor configured to specify, from a cross spectrum between the first frequency spectrum converted from the first impulse response of the first time region and the second frequency spectrum converted from the second impulse response of the second time region, and amplitude component of the second frequency spectrum with a peak relatively higher than that of an amplitude component of the first frequency spectrum, and extract the peak as a resonance component;
a synthesizer configured to synthesize a first property with a second property for attenuating the resonance component to generate a synthesized property, a correction filter configured to correct a third audio signal to be output by the output module and to be listened to; and
a filter configured to filter the third audio signal to be output by the output module by using the correction filter generated by the generator.

4. The audio output apparatus of claim 3, further comprising a signal generator configured to generate the first audio signal to be output by the output module for measuring acoustic property of the sound field, wherein
the output module is configured to output the first audio signal generated by the signal generator.

5. An acoustic correction method executed by an acoustic correction apparatus, comprising:
receiving, by an input module, a first audio signal propagated through a sound field;
calculating, by a calculator, an impulse response from the first audio signal,
dividing, by a divider, the impulse response into a first impulse response of a first time region preliminarily determined as a time region comprising a direct sound or an initial reflection sound and a second impulse response of a second time region preliminarily determined as a time region comprising a reverberant sound component;
converting, by a converter, the first impulse response into a first frequency spectrum and the second impulse response into a second frequency spectrum;
specifying, by an extractor, from a cross spectrum between the first frequency spectrum converted from the first impulse response of the first time region and the second frequency spectrum converted from the second impulse response of the second time region, an amplitude component of the second frequency spectrum with at peak relatively higher than that of the amplitude component of the first frequency spectrum, and extracting the peak as a resonance component;
synthesizing, by a synthesizer, a first property with a second property for attenuating the resonance component to generate a synthesized property; and
generating, by a generator and based on the synthesized property, a correction filter configured to correct a second audio signal to be listened to.

* * * * *

UNITED STATES PATENT AND TRADEMARK OFFICE
CERTIFICATE OF CORRECTION

PATENT NO. : 8,498,429 B2
APPLICATION NO. : 13/044327
DATED : July 30, 2013
INVENTOR(S) : Yasuhiro Kanishima et al.

It is certified that error appears in the above-identified patent and that said Letters Patent is hereby corrected as shown below:

In the Claims

In column 8, claim 1, line 39, replace "ore" with "more".

In column 8, claim 1, line 43, replace "processor" with "processors".

In column 8, claim 1, line 44, insert --first-- before "audio".

In column 9, claim 3, line 14, insert --an output module configured to output a first audio signal;-- after "one or more hardware processors".

In column 9, claim 3, line 41, insert --; a generator configured to generate, based on the synthesized property-- before ", a correction".

In column 10, claim 4, line 8, insert --an-- before "acoustic".

Signed and Sealed this
First Day of October, 2013

Teresa Stanek Rea
*Deputy Director of the United States Patent and Trademark Office*